(12) United States Patent
Shimizu et al.

(10) Patent No.: US 11,217,734 B2
(45) Date of Patent: Jan. 4, 2022

(54) PATTERNED LUMIRAMIC FOR IMPROVED PCLED STABILITY

(71) Applicant: LUMILEDS LLC, San Jose, CA (US)

(72) Inventors: Kentaro Shimizu, Sunnyvale, CA (US); Hisashi Masui, San Jose, CA (US); Marcel Rene Bohmer, Eindhoven (NL); Vernon Wong, Mountain View, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/600,321

(22) Filed: Oct. 11, 2019

(65) Prior Publication Data

US 2020/0212266 A1  Jul. 2, 2020

Related U.S. Application Data

(60) Provisional application No. 62/785,637, filed on Dec. 27, 2018.

(51) Int. Cl.
| | |
|---|---|
| *H01L 33/50* | (2010.01) |
| *H01L 21/762* | (2006.01) |
| *H01L 21/02* | (2006.01) |
| *H01L 21/768* | (2006.01) |
| *F21V 5/04* | (2006.01) |

(Continued)

(52) U.S. Cl.
CPC ...... *H01L 33/505* (2013.01); *H01L 21/02244* (2013.01); *H01L 21/02614* (2013.01); *H01L 21/76227* (2013.01); *H01L 21/76888* (2013.01); *H01L 33/507* (2013.01); *C23C 8/10* (2013.01); *C23C 16/06* (2013.01); *F21S 41/24* (2018.01); *F21S 41/25* (2018.01); *F21V 5/045* (2013.01); *H01L 2933/0033* (2013.01); *H01L 2933/0041* (2013.01)

(58) Field of Classification Search
CPC ............. H01L 33/505; H01L 33/507; H01L 21/02614; H01L 21/002244; H01L 21/283; H01L 21/31051; H01L 21/76227; H01L 21/76888; C23C 8/10; C23C 16/06
USPC .......................................... 257/98
See application file for complete search history.

(56) References Cited

U.S. PATENT DOCUMENTS

| | | |
|---|---|---|
| 10,001,657 B2 | 6/2018 | Fujii et al. |
| 2011/0175117 A1* | 7/2011 | Jagt .......... H01L 33/44 |
| | | 257/88 |

(Continued)

FOREIGN PATENT DOCUMENTS

| | | |
|---|---|---|
| TW | 2017002352 A | 1/2017 |
| WO | 2013041525 A1 | 3/2013 |
| WO | 2013/148276 A1 | 10/2013 |

OTHER PUBLICATIONS

EPO as the ISA; PCT International Search Report, PCT/IB2019/001371, dated May 25, 2020, 3 pages.

(Continued)

*Primary Examiner* — David Vu
*Assistant Examiner* — Brandon C Fox

(57) ABSTRACT

Patterned ceramic wavelength-converting phosphor structures may be bonded to an LED to form a pcLED. The phosphor structures are patterned with features that provide enhanced oxygen permeability to an adhesive bond used to attach the phosphor structure to the LED. The enhanced oxygen permeability reduces transient degradation of the pcLED occurring in the region of the adhesive bond.

11 Claims, 6 Drawing Sheets

(51) Int. Cl.
  *F21S 41/25*   (2018.01)
  *F21S 41/24*   (2018.01)
  *C23C 8/10*    (2006.01)
  *C23C 16/06*   (2006.01)

(56)          References Cited

U.S. PATENT DOCUMENTS

| | | | |
|---|---|---|---|
| 2012/0007131 A1* | 1/2012 | Ueno | H01L 33/508 |
| | | | 257/98 |
| 2012/0086028 A1 | 4/2012 | Beeson et al. | |
| 2013/0258637 A1* | 10/2013 | Wang | H01L 33/505 |
| | | | 362/84 |
| 2016/0300985 A1* | 10/2016 | Gootz | C09K 11/70 |
| 2017/0139224 A1 | 5/2017 | Fujii et al. | |
| 2017/0254489 A1* | 9/2017 | Hikmet | F21S 41/176 |
| 2018/0122993 A1 | 5/2018 | Camras et al. | |
| 2018/0287341 A1 | 10/2018 | Lee et al. | |

OTHER PUBLICATIONS

PCT Written Opinion of the International Searching Authority, PCT/IB2019/001371, dated May 25, 2020, 6 pages.

* cited by examiner

PATTERNED LUMIRAMIC FOR IMPROVED PCLED STABILITY

CROSS REFERENCE TO RELATED APPLICATIONS

This application claims benefit of priority to U.S. Provisional Patent Application No. 62/785,637 titled "Patterned Lumiramic For Improved PCLED Stability" and filed Dec. 27, 2018, which is incorporated herein by reference in its entirety.

FIELD OF THE INVENTION

The invention relates generally to phosphor-converted light emitting diodes.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED.

Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

SUMMARY

This specification discloses patterned ceramic wavelength-converting phosphor structures (referred to herein as "lumiramics") that may be bonded to an LED to form a pcLED. These lumiramics are patterned with features that provide enhanced oxygen permeability to an adhesive bond used to attach the lumiramic to the LED. The enhanced oxygen permeability reduces transient degradation of the pcLED occurring in the region of the adhesive bond, and may also reduce permanent degradation occurring in that region.

Other embodiments, features and advantages of the present invention will become more apparent to those skilled in the art when taken with reference to the following more detailed description of the invention in conjunction with the accompanying drawings that are first briefly described.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

Figure 1:
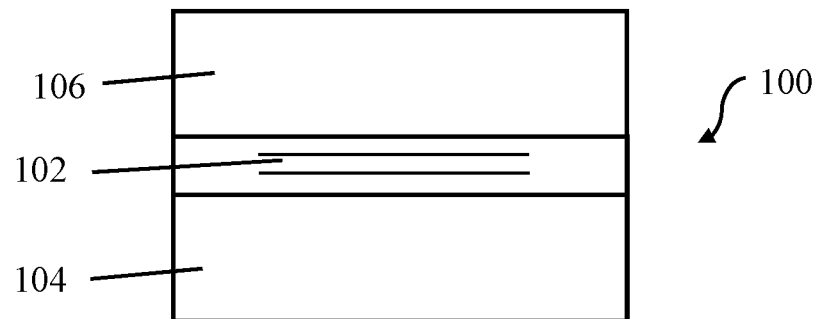
FIG. 1 shows a schematic cross-sectional view of an example pcLED.

FIG. 1 shows an example of an individual pcLED 100 comprising a semiconductor diode structure 102 disposed on a substrate 104, together considered herein an "LED", and a phosphor layer or structure 106 disposed on the LED. Semiconductor diode structure 102 typically comprises an active region disposed between n-type and p-type layers. Application of a suitable forward bias across the diode structure results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Other suitable material systems may include, for example, III-Phosphide materials, III-Arsenide materials, and II-VI materials.

Any suitable phosphor materials may be used, depending on the desired optical output from the pcLED. This specification focuses on use of ceramic phosphor structures (lumiramics) as wavelength converters in pcLEDs.

Figure 2A:
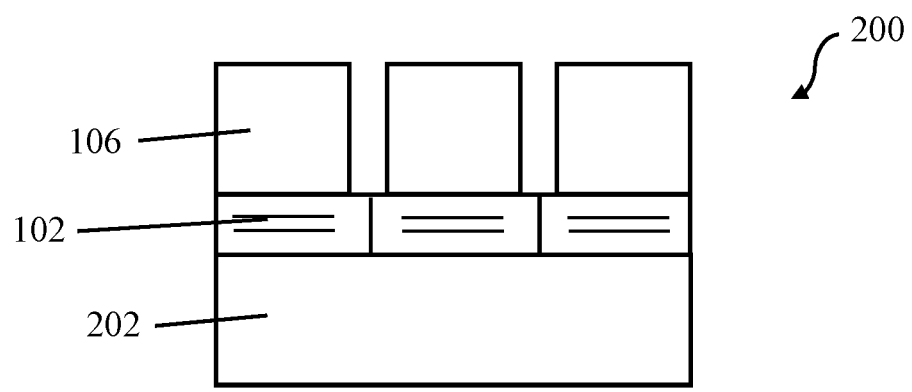
FIGS. 2A and 2B show, respectively, cross-sectional and top schematic views of an array of pcLEDs.
Figure 2B:
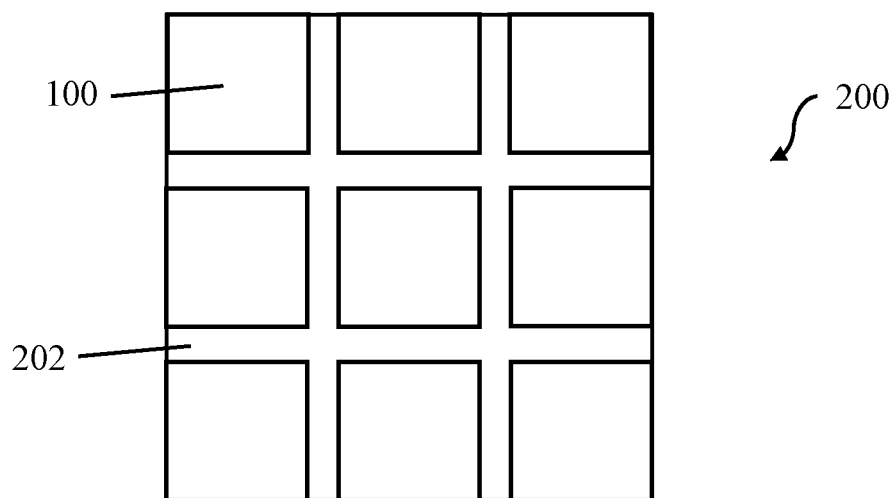

FIGS. 2A-2B show, respectively, cross-sectional and top views of an array 200 of pcLEDs 100 including phosphor pixels 106 disposed on a substrate 202. Such an array may include any suitable number of pcLEDs arranged in any suitable manner. In the illustrated example the array is depicted as formed monolithically on a shared substrate, but alternatively an array of pcLEDs may be formed from separate individual pcLEDs. Substrate 202 may optionally comprise CMOS circuitry for driving the LED, and may be formed from any suitable material.

Figure 3A:
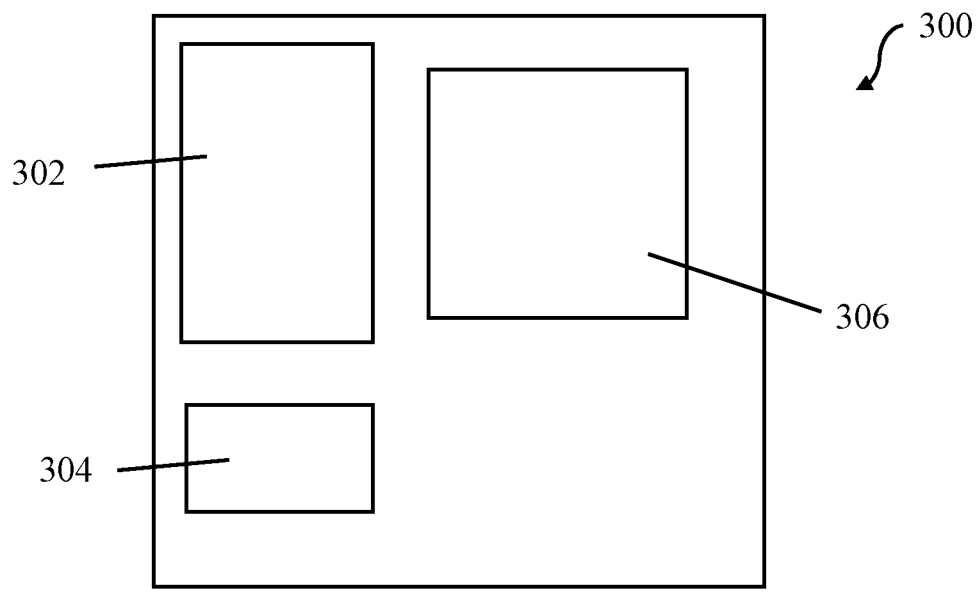
FIG. 3A shows a schematic top view an electronics board on which an array of pcLEDs may be mounted, and FIG. 3B similarly shows an array of pcLEDs mounted on the electronic board of FIG. 3A.
Figure 3B:
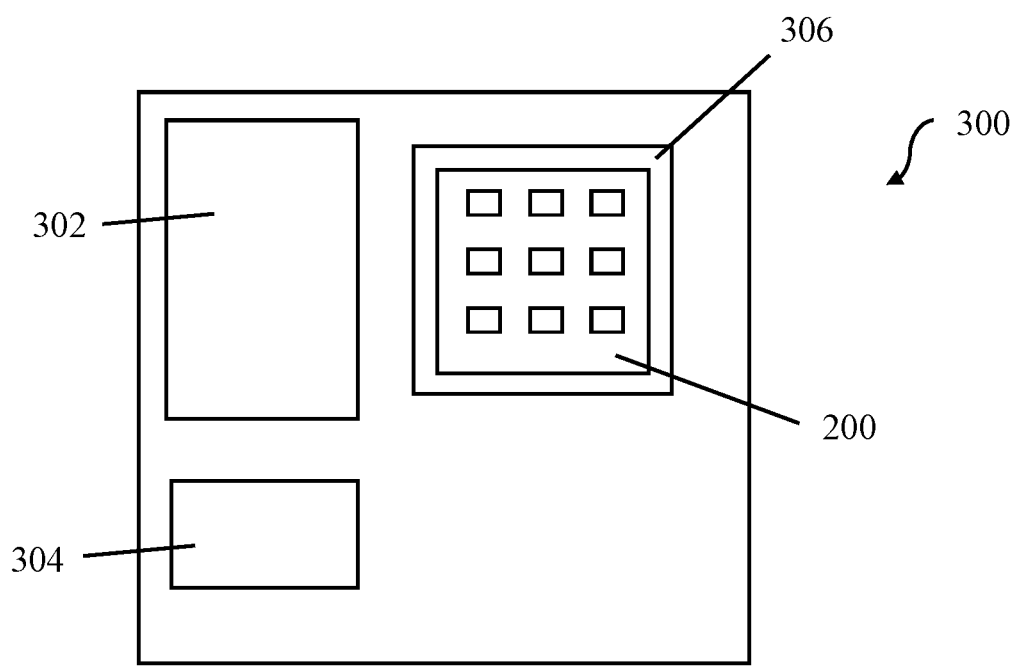

As shown in FIGS. 3A-3B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

Figure 4A:
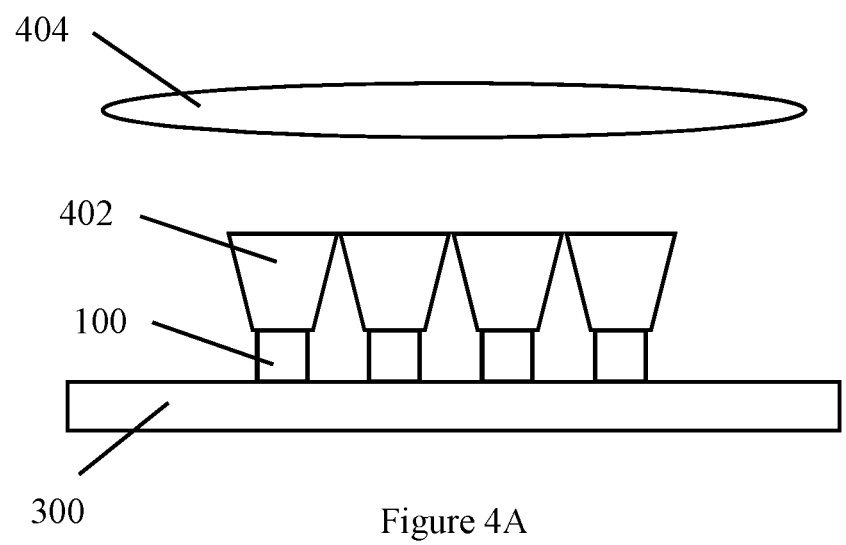
FIG. 4A shows a schematic cross sectional view of an array of pcLEDs arranged with respect to waveguides and a projection lens.
Figure 4B:
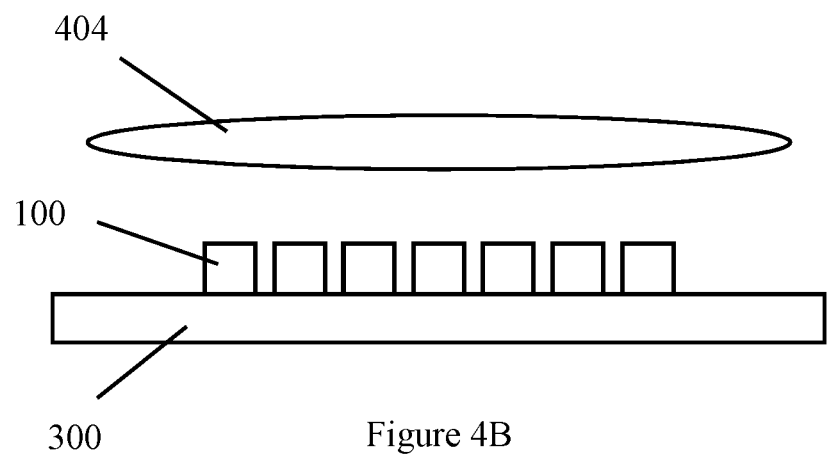
FIG. 4B shows an arrangement similar to that of FIG. 4A, without the waveguides.

Individual pcLEDs may optionally incorporate or be arranged in combination with a lens or other optical element located adjacent to or disposed on the phosphor layer. Such an optical element, not shown in the figures, may be referred to as a "primary optical element". In addition, as shown in FIGS. 4A-4B a pcLED array 200 (for example, mounted on an electronics board 300) may be arranged in combination with secondary optical elements such as waveguides, lenses, or both for use in an intended application. In FIG. 4A, light emitted by pcLEDs 100 is collected by waveguides 402 and directed to projection lens 404. Projection lens 404 may be a Fresnel lens, for example. This arrangement may be suitable for use, for example, in automobile headlights. In FIG. 4B, light emitted by pcLEDs 100 is collected directly by projection lens 404 without use of intervening waveguides. This arrangement may particularly be suitable when pcLEDs can be spaced sufficiently close to each other, and may also be used in automobile headlights as well as in camera flash applications. A microLED display application may use similar optical arrangements to those depicted in FIGS. 4A-4B, for example. Generally, any suitable arrangement of optical elements may be used in combination with the pcLEDs described herein, depending on the desired application.

High power pcLEDs may comprise a ceramic phosphor structure (lumiramic), for example in the form of a platelet, attached to a semiconductor LED device using a silicone adhesive. Such high power pcLEDs may be used for automotive front lighting applications, for example, as well as for other applications. In operation of such a high power pcLED, the lumiramic is heated during the wavelength conversion process by the difference in energy between the excitation light photons from the LED and the photons emitted in response by the lumiramic. As the lumiramic heats up, its conversion efficiency may decline as a result of thermal quenching of the emission process.

As a consequence, it is desirable to reduce the thickness of the silicone adhesive layer between the lumiramic and the LED, to reduce thermal resistance between the lumiramic and the LED and thereby maintain a lower operating temperature for the lumiramic and thus reduce thermal quenching.

However, reducing the thickness of the silicone adhesive layer may also have undesirable effects because doing so slows diffusion of oxygen into and through the adhesive layer. Oxygen diffusing into and through the adhesive layer at a sufficient rate can reduce or avoid premature and transient or long-term degradation (darkening of the adhesive) resulting from residual or inherent organic contamination in or near the silicone adhesive. Further, if the silicone degrades, losing $CH_3$, phenyl groups, or oligomers for example, the adhesive layer becomes more open for contaminants to flow in. If the oxygen level is low, this may lead to darkening. Therefore, reducing the thickness of the silicone adhesive layer may have the unfortunate consequence of promoting premature and transient degradation of the pcLED, particularly at interior portions of the adhesive layer farthest from edges of the pcLED through which oxygen might enter the layer.

As summarized above, this specification discloses ceramic wavelength-converting phosphor structures (lumiramics) that are patterned on a surface that is to be attached to the semiconductor LED with features that will enhance diffusion of oxygen to and through the adhesive layer that bonds the lumiramic to the LED. Such features may include, for example, one or more oxygen permeable holes or channels (e.g., grooves) in the surface. In addition, or alternatively, the features may comprise tapered or stepped outer portions of the surface, resulting in the adhesive layer being thicker along peripheral portions of the surface than at a central portion of the surface. The enhanced oxygen diffusion reduces transient degradation of the pcLED occurring in the region of the adhesive bond.

As further described below, such holes may, for example, pass vertically through the lumiramic perpendicularly to the patterned surface or pass through the lumiramic at an acute or obtuse angle to the patterned surface. The holes may have a diameter of, for example, between about 5 microns and about 100 microns. The holes may have a conical shape. For example, vertical holes may have a conical shape with a diameter of about 30 microns at the bottom surface and a diameter of about 80 to about 100 microns at the top surface of the lumiramic, or have any other suitable dimensions. Any suitable hole diameter and shape may be used.

The channels may, for example, extend parallel to the patterned surface to a side edge of the lumiramic at which oxygen may enter the channel. The channels may have, for example, widths parallel to the patterned surface of about 5 to about 50 microns and heights perpendicular to the patterned surface of about 5 to about 10 microns, or any other suitable dimensions. The channels may have dimensions of, for example, 5 microns depth and 10 microns width. Holes and channels may be used in combination, in which case channels may interconnect two or more holes. The channels, or portions of the channels, may have the shape of lines, circles, nodes, or intersections of such features, for example.

For lumiramics comprising tapered or stepped outer portions of the surface to be attached to the LED, the taper or step may result in a height difference between edges of the surface and central portions of the surface of, for example, about 2 to about 20 microns.

A silicone adhesive layer used to attach a patterned lumiramic to a semiconductor LED may have a thickness perpendicular to the patterned surface of the lumiramic of, for example, less than about 4 microns, less than about 2 microns, less than about 1 micron, or less than about 0.5 micron. The pattern on the lumiramic allows for much of the patterned surface of the lumiramic, or the majority of the patterned surface of the lumiramic, to be within a small distance (less than about 2 microns, for example) from the LED determined by the thickness of the adhesive layer, while facilitating diffusion of oxygen to spatial locations in the adhesive layer where degradation would otherwise be most likely to occur. The diffusion of oxygen may be, for example, through holes having a diameter greater than or equal to the thickness of the adhesive layer and/or through channels having a height perpendicular to the patterned surface of greater than or equal to the thickness of the adhesive layer.

The fill factor of the pattern on the patterned surface of the lumiramic may be, for example, less than or equal to about 60% of that surface to allow for sufficient thermal pathways between the lumiramic and the LED semiconductor device through the thinnest portion of the adhesive layer attaching the lumiramic to the LED.

Some or all of the pattern features (e.g., holes or channels) in the lumiramic may be filled with a small grain phosphor dispersed in an encapsulant, for example a phosphor dispersed in a silicone encapsulant, to reduce color or intensity variation in the output from the lumiramic that might otherwise result from the pattern. This may be done before or after attachment of the lumiramic to the LED. Alternatively, or in addition, some or all of the pattern features may be filled with a silicone adhesive used to bond the lumiramic to the LED.

The lumiramics may be tape cast to form sheets having a thickness of, for example, about 80 to about 120 microns. Any other suitable thickness may also be used. The pattern features may be subsequently formed in a lumiramic by, for example, ablation using a femtosecond laser operating at a wavelength of, for example, 517 nanometers. The laser can be used to create vertical or angled holes in the lumiramic. The diameter and shape (e.g., tapered aperture of a conical hole) of such a hole can be modified based on the speed of the laser drilling and the total thickness of the lumiramic. The same laser can be used to create channels in the surface of the lumiramic without drilling a hole through the lumiramic.

The pattern features on the lumiramic may instead be formed by any other suitable method or combination of methods, for example by mechanical sawing or chemical etching.

Figure 5A:
FIG. 5A and FIG. 5B show plan and cross-sectional schematic views of an example unpatterned lumiramic wafer.
Figure 5B:
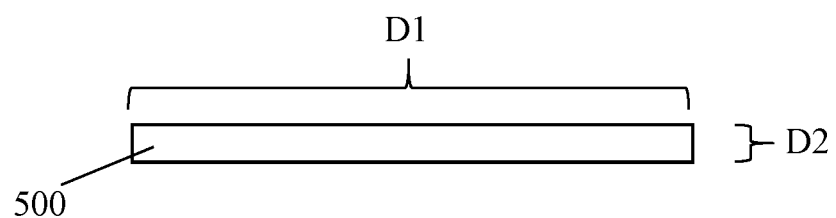

Referring now to the plan and cross-sectional views shown in FIGS. 5A and 5B, respectively, a lumiramic wafer 500 may be initially formed as a plate having a length (or diameter, if circular in shape) D1 and a thickness D2. In FIG. 5A, the wafer is shown schematically as rectangular, for simplicity. D1 may be, for example, about 30 millimeters (mm) to about 50 mm. D2 may be, for example, about 60 microns to about 130 microns, for example about 120 microns.

Lumiramic wafer 500 may then be patterned with any suitable combination of features, for example with channels 510 (FIG. 6A), tapered holes 515 (FIG. 6B), angled holes 520 (FIG. 6C), a stepped surface profile thinner at the edges 525 than at the center 530 (FIG. 6D), a tapered surface profile thinner at the edges 525 than at the center 530 (FIG. 6E), or a combination of any of these features or of any other suitable features. A pattern comprising one or more such features may be repeated across the lumiramic wafer, so that the wafer may subsequently be divided into a plurality of lumiramic platelets each having essentially identical dimensions (for example 1 mm×1 mm, or 0.5 mm×0.5 mm) and identical patterned surfaces. The platelets may typically be divided (e.g., sawn) from the wafer with a pitch between 0.7 mm and 1.4 mm, but the pitch can be much smaller, for example down to 0.2 mm in certain cases. The dimensions for the platelets are similar to those of the LEDs to which they will be attached. Depending on various use cases, the platelet may be slightly larger (10 microns to 100 microns overhang) or slightly smaller (30 microns to 50 microns insert) than the LED die.

Figure 6A:
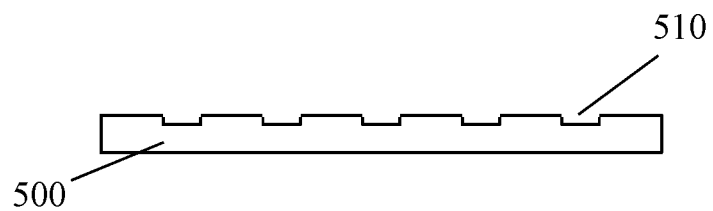
FIG. 6A, FIG. 6B, FIG. 6C, FIG. 6D, and FIG. 6E show example schematic cross-sectional views of example patterned lumiramics.
Figure 6B:
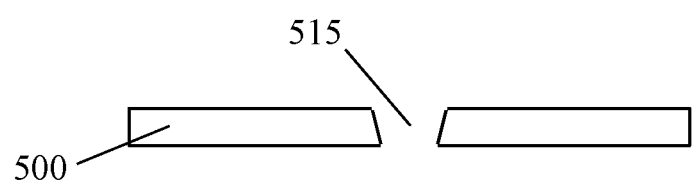
Figure 6C:
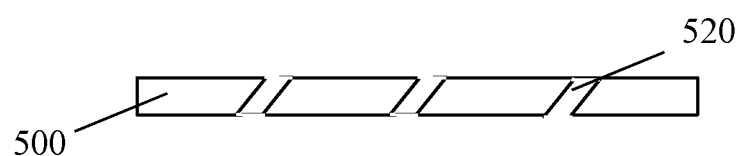
Figure 6D:
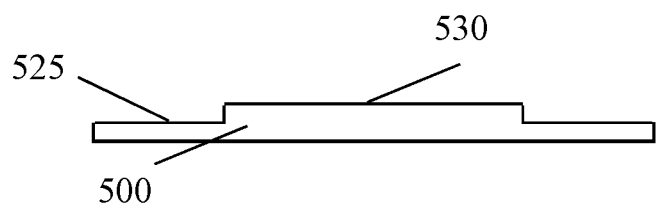
Figure 6E:
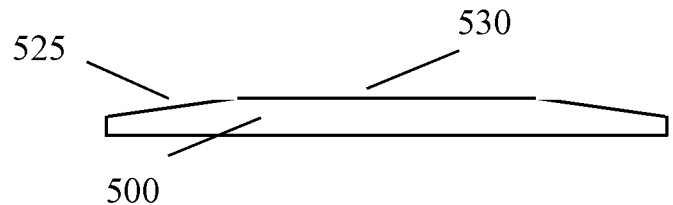

FIGS. 7A-7E schematically illustrate an example method for fabricating pcLEDs having patterned lumiramics, using for illustrative purposes a patterned lumiramic wafer 500 comprising channels 510 as shown in FIG. 6A. As shown FIG. 7A, an adhesive layer 535 is applied to the patterned surface of the lumiramic wafer.

Figure 7A:
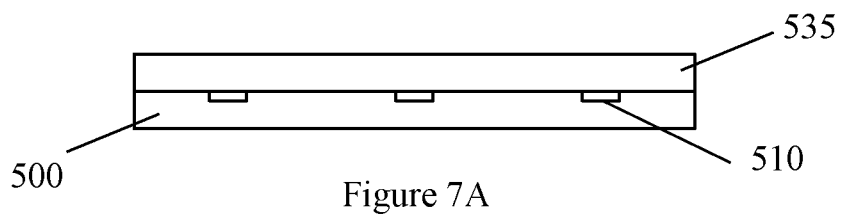
FIG. 7A, FIG. 7B, FIG. 7C, FIG. 7D, and FIG. 7E schematically show stages in the fabrication of a pcLED using an example patterned lumiramic wafer.
Figure 7B:
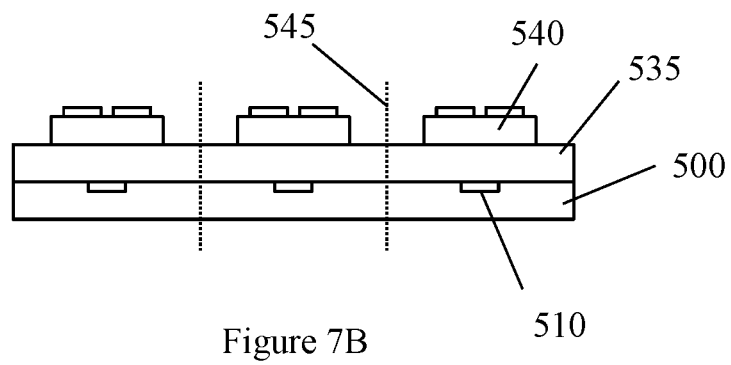
Figure 7C:
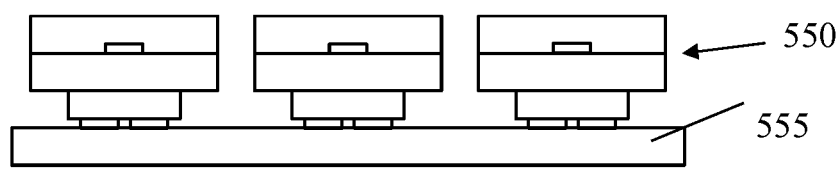

Subsequently, as shown in FIG. 7B, semiconductor LED dice 540 are attached to adhesive layer 535 in position over corresponding portions of the patterned lumiramic wafer. This may comprise an adhesive curing step. The resulting assembly is then separated into individual pcLEDs 550 along separation lines 545, for example by sawing or cleaving. The resulting individual pcLEDs may then be arranged, LED die down, on a substrate 555 (FIG. 7C).

The channels 510 (more generally, the pattern features) in the patterned lumiramic may be back-filled with phosphor particles dispersed in an encapsulant, as described above, after the LED dice are attached to the lumiramic with the adhesive. Such backfilling may occur before or after separation of the wafer assembly into individual pcLEDs. If the pattern features are not back-filled with phosphor and encapsulant, then it may be desirable to insure that the adhesive in layer 535 flows into the pattern features to eliminate voids or air pockets that might affect light transmission into and through the lumiramic. The encapsulant can be a silicone with refractive index (RI) of between 1.41 and 1.6 of optical quality intended for LED applications such as LPS3419 and LPS5595 from Shin Etsu Chemical Co. The general trend is that the lower RI silicones also have a higher oxygen permeability so that maybe preferential to use.

Figure 7D:
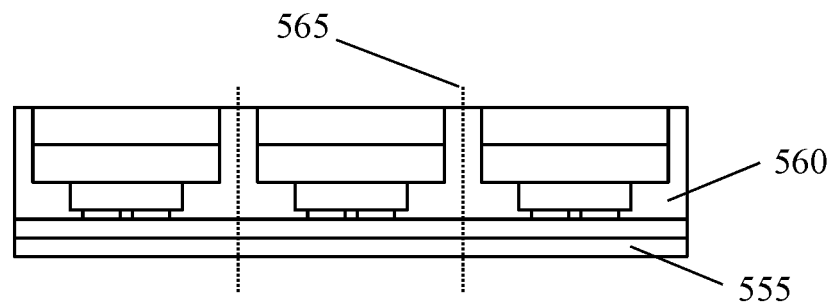
Figure 7E:
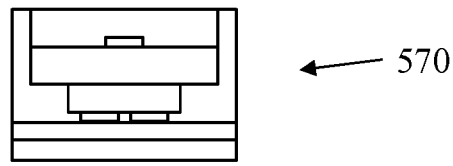

Subsequently, as shown in FIG. 7D, reflective side coat material 560 is disposed between adjacent pcLEDs on substrate 555 and then the resulting assembly is separated along separation lines 565 into separate pcLEDs 570, each on a substrate and comprising optical side reflectors.

The performance of a 1 mm×1 mm pcLED comprising a patterned lumiramic was compared to the performance of an otherwise essentially identical 1 mm×1 mm pcLED having an unpatterned lumiramic. The patterned lumiramic had a single vertical conical hole centered in the lumiramic, with the hole having a diameter of about 30 microns at the face of the lumiramic attached to the semiconductor LED and a diameter of about 80 to about 100 microns at the opposing top face of the lumiramic.

Figure 8:
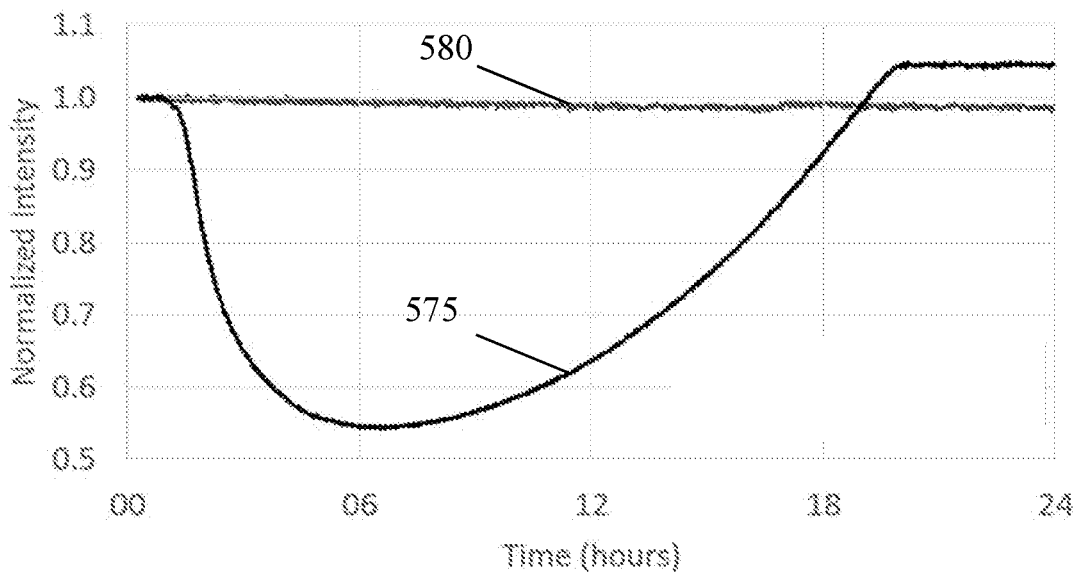
FIG. 8 shows a plot of pcLED emission intensity versus time that demonstrates reduction or elimination of transient degradation by use of a patterned lumiramic.

FIG. 8 shows a plot of output light intensity versus time in operation for both of these LEDs. Curve 575 shows the performance of the pcLED having an unpatterned lumiramic, which exhibited a transient degradation of about 50% after about 6 hours of operation, recovering after about 18 to 20 hours of operation. A large and pronounced darkened region was visible through the unpatterned lumiramic during this period. In contrast, as indicated by curve 580, the pcLED having the patterned lumiramic did not exhibit any transient degradation.

This disclosure is illustrative and not limiting. Further modifications will be apparent to one skilled in the art in light of this disclosure and are intended to fall within the scope of the appended claims.

What is claimed is:
1. A wavelength converter comprising:
  a ceramic phosphor structure configured to absorb light of a first wavelength emitted by an LED and in response emit light of a longer wavelength, having a first surface configured to be bonded to the LED by an adhesive layer and a second surface opposite the first surface, and comprising outer tapered portions; and a pattern on the first surface of the ceramic phosphor structure comprising one or more pattern features configured to facilitate a flow of oxygen to or along the first surface and through the adhesive layer, the one or more pattern features comprising:
   one or more channels in the first surface that do not penetrate entirely through the ceramic phosphor structure to reach the second surface; or
   one or more holes passing entirely through the ceramic phosphor structure and comprising at least one sidewall having a non-perpendicular angle with respect to the first surface of the ceramic phosphor structure.

2. The wavelength converter of claim 1, wherein the one or more pattern features comprise the one or more holes passing entirely through the ceramic phosphor structure and comprising the at least one sidewall having the non-perpendicular angle with respect to the first surface of the ceramic phosphor structure.

3. The wavelength converter of claim 2, wherein the one or more holes comprise at least another sidewall having a perpendicular angle with respect to the first surface of the ceramic phosphor structure.

4. The wavelength converter of claim 2, wherein the at least one sidewall has an acute angle with respect to the first surface of the ceramic phosphor structure.

5. The wavelength converter of claim 2, wherein the at least one sidewall has an obtuse angle with respect to the first surface of the ceramic phosphor structure.

6. The wavelength converter of claim 2, wherein the at least one sidewall comprises two sidewalls extending parallel to each other.

7. The wavelength converter of claim 1, wherein the one or more pattern features comprise the one or more channels in the first surface that do not penetrate entirely through the ceramic phosphor structure to reach the second surface.

8. A wavelength converter comprising:
   a ceramic phosphor structure configured to absorb light of a first wavelength emitted by an LED and in response emit light of a longer wavelength, and having a first surface configured to be bonded to the LED by an adhesive layer and a second surface opposite the first surface; and
   a pattern on the first surface of the ceramic phosphor structure comprising one or more pattern feature configured to facilitate a flow of oxygen to or along the first surface and through the adhesive layers, the one or more pattern features comprising one or more channels, the one or more pattern features comprising one or more holes that pass entirely through the ceramic phosphor structure and intersect at least one of the one or more channels.

9. The phosphor-converted LED of claim 8, wherein one of the one or more channels intersects two of the one or more holes.

10. The phosphor-converted LED of claim 9, wherein the adhesive layer has a thickness of less than or equal to about 2 microns.

11. The phosphor converted LED of claim 10, wherein the one or more channels are filled with phosphor particles dispersed in an encapsulant.

* * * * *